United States Patent
Tsai

(10) Patent No.: US 6,400,260 B1
(45) Date of Patent: Jun. 4, 2002

(54) APPARATUS FOR DISPLAYING ELECTRICAL MEASUREMENT OF DISTRIBUTOR OF MOTOR VEHICLE

(75) Inventor: Liao-Tai Tsai, Taipei (TW)

(73) Assignee: Real Power Cap Company, Taipei (TW)

( * ) Notice: Subject to any disclaimer, the term of this patent is extended or adjusted under 35 U.S.C. 154(b) by 0 days.

(21) Appl. No.: 09/484,541

(22) Filed: Jan. 18, 2000

(51) Int. Cl.[7] .................................................. B60Q 1/00
(52) U.S. Cl. ........................ 340/439; 340/660; 340/664; 340/691.6; 340/815.44; 340/815.45
(58) Field of Search ................................ 340/438, 439, 340/635, 641, 660, 664, 691.6, 815.45, 815.44

(56) References Cited

U.S. PATENT DOCUMENTS

| | | | | |
|---|---|---|---|---|
| 3,946,309 A | * | 3/1976 | Hasbrouck | 324/384 |
| 4,312,043 A | * | 1/1982 | Frank et al. | 701/102 |
| 4,817,418 A | * | 4/1989 | Asami et al. | 73/118.1 |
| 4,977,391 A | * | 12/1990 | Coquerel | 340/522 |

* cited by examiner

Primary Examiner—Daniel J. Wu
(74) Attorney, Agent, or Firm—Birch, Stewart, Kolasch & Birch, LLP

(57) ABSTRACT

An apparatus for displaying electrical measurement of distributor of motor vehicle comprises a circuit module mounted on distributor. Circuit module comprises at least one display unit, a circuit board, and a plurality of flexible pins wherein pins are electrically connected between circuit module and distributor such that circuit board may be electrically activated by the power supplied by distributor through the pins. A transparent cover is provided to enable user to see the electrical measurement on display unit. With this, a multimeter for detecting malfunction of a certain electrical component is eliminated.

13 Claims, 7 Drawing Sheets

APPARATUS FOR DISPLAYING ELECTRICAL MEASUREMENT OF DISTRIBUTOR OF MOTOR VEHICLE

BACKGROUND OF THE INVENTION

1. Field of Invention

The present invention relates to distributor of motor vehicle and more particularly to an apparatus for displaying electrical measurement of distributor of motor vehicle such that user may see the desired electrical measurement directly, and thus a multimeter for detecting malfunction of a certain component is eliminated.

2. Related Art

Conventionally, power supplied by battery 20 of a motor vehicle is distributed to the electrical devices such as stereo, head light, directional light, and brake light, etc by a distributor 10 as illustrated in FIG. 1. In detail, distributor 10 has an input terminal 111 electrically connected to battery 20 through a cable 51 and a plurality of output terminals 112 electrically connected to above electrical devices 30 through a corresponding cable 52. Such that, each electrical device 30 may function properly. A fuse block 113 is also provided in the connection between input terminal 111 and each output terminal 112 as a safeguard for preventing overload. Further, a cover 12 is provided for preventing dust and foreign bodies from entering the distributor 10.

But this is unsatisfactory for the purpose for which the invention is concerned for the following reason. It is known that distributor 10 is typically provided around engine under the hood. It is required to open the hood to perform an appropriate check if there is a malfunction occurred in one of the electrical devices 30 or, alternatively, a routine check is required. Then use a multimeter to measure the distributor 10 for determining which fuse is melted or whether voltage is normal. In view of this, it is quite inconvenient. Further, driver may be bothered to find a multimeter or any of other suitable tools to perform such check. Moreover, an additional money and time are spent to buy and use such tool.

SUMMARY OF THE INVENTION

It is therefore an object of the present invention to provide a novel apparatus for displaying electrical measurement of distributor of motor vehicle such that user may see the desired electrical measurement directly, and thus a multimeter for detecting malfunction of a certain component is eliminated.

The advantages of the present invention are realized by providing an apparatus for displaying electrical measurement of distributor of motor vehicle comprising a distributor and a circuit module. Circuit module comprises at least one display unit, a circuit board, and a plurality of flexible pins wherein pins are electrically connected between circuit module and distributor such that circuit board may be electrically activated by the power supplied by distributor through the pins. Further, an appropriate representation is displayed on the display unit. Display unit may be implemented as a plurality of light emitting diodes (LEDs) if there is a fuse block provided on the distributor. An on/off or a selected color may be used to represent whether a corresponding fuse is normal. A liquid crystal display (LCD) may be additionally provided to display current or voltage value. A transparent cover is provided on the distributor to prevent dust and foreign bodies from entering the distributor. Also, user may clearly see LEDs and voltage or current value on LCD associated with the corresponding fuse through the transparent cover. A button is provided on the circuit module for switching between voltage and current values wherein button is protruded through a hole of cover for easy of manipulation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become fully understood from the detailed description given hereinbelow illustration only, and thus are not limitative of the present invention, and wherein.

DETAILED DESCRIPTION OF THE INVENTION

Figure 1:
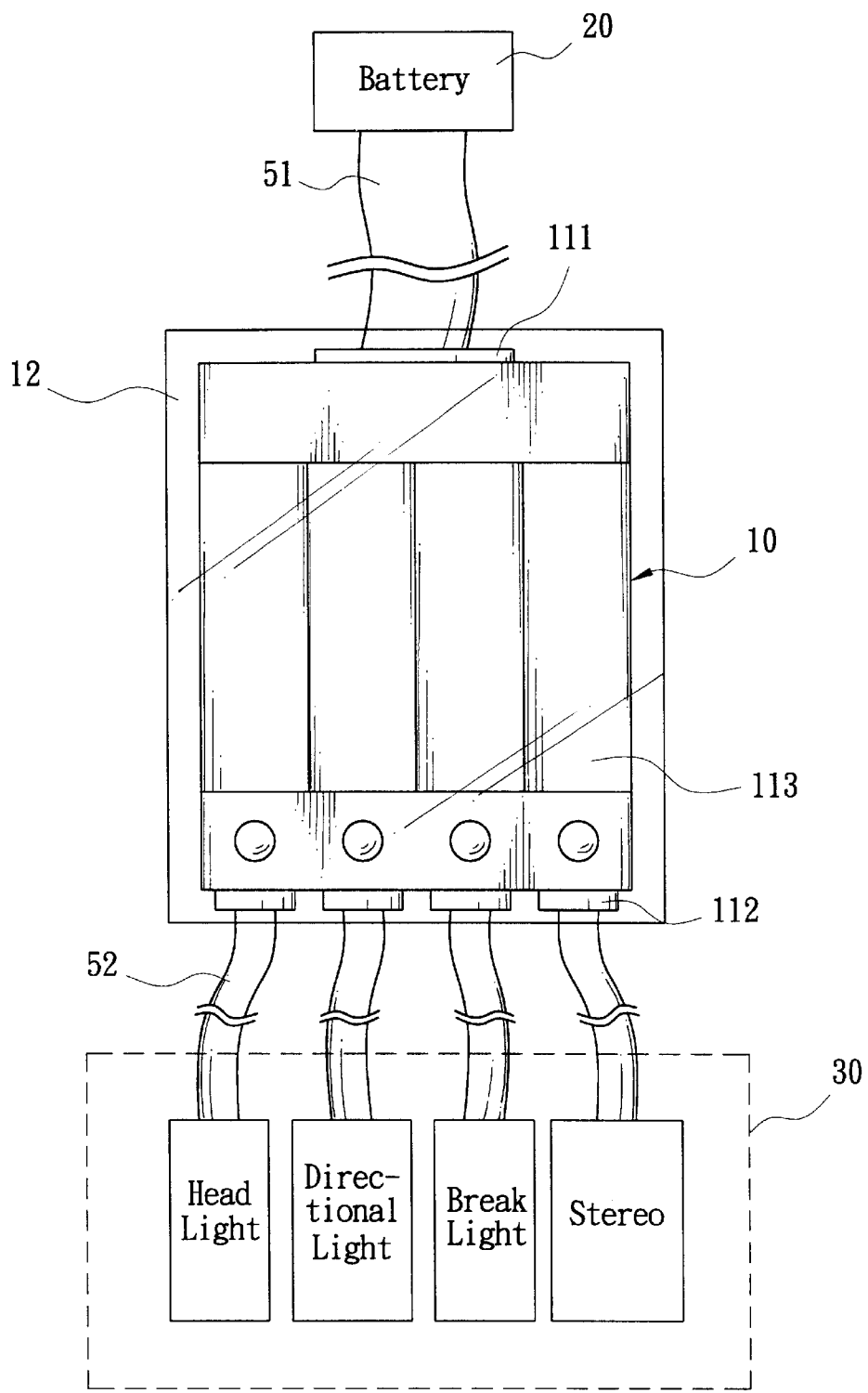
FIG. 1 is a block diagram schematically illustrating a prior art distributor electrically connected between battery and various electrical devices.
Figure 2A:
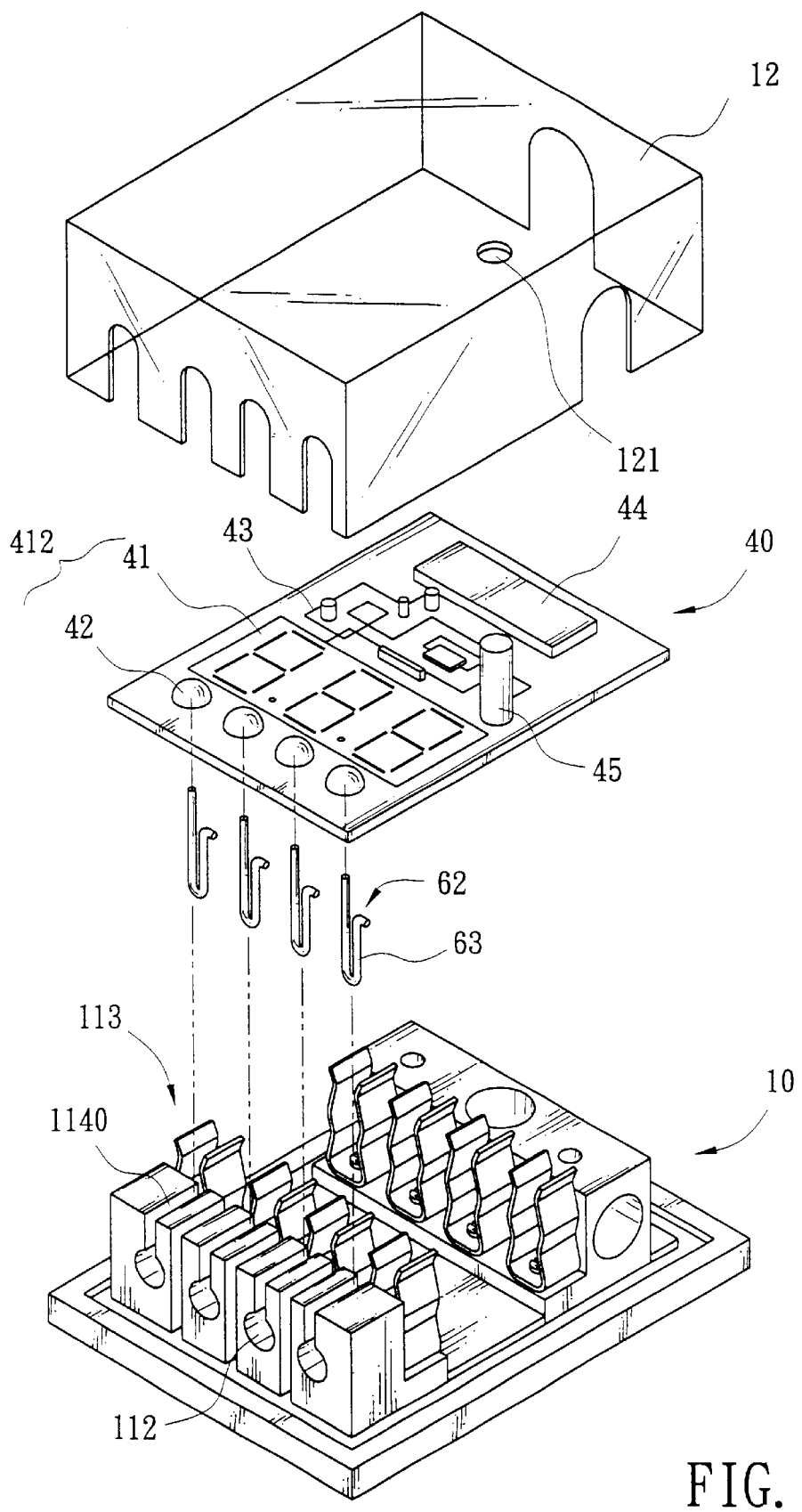
FIG. 2A is an exploded view illustrating a first preferred embodiment of distributor of the present invention.
Figure 2B:
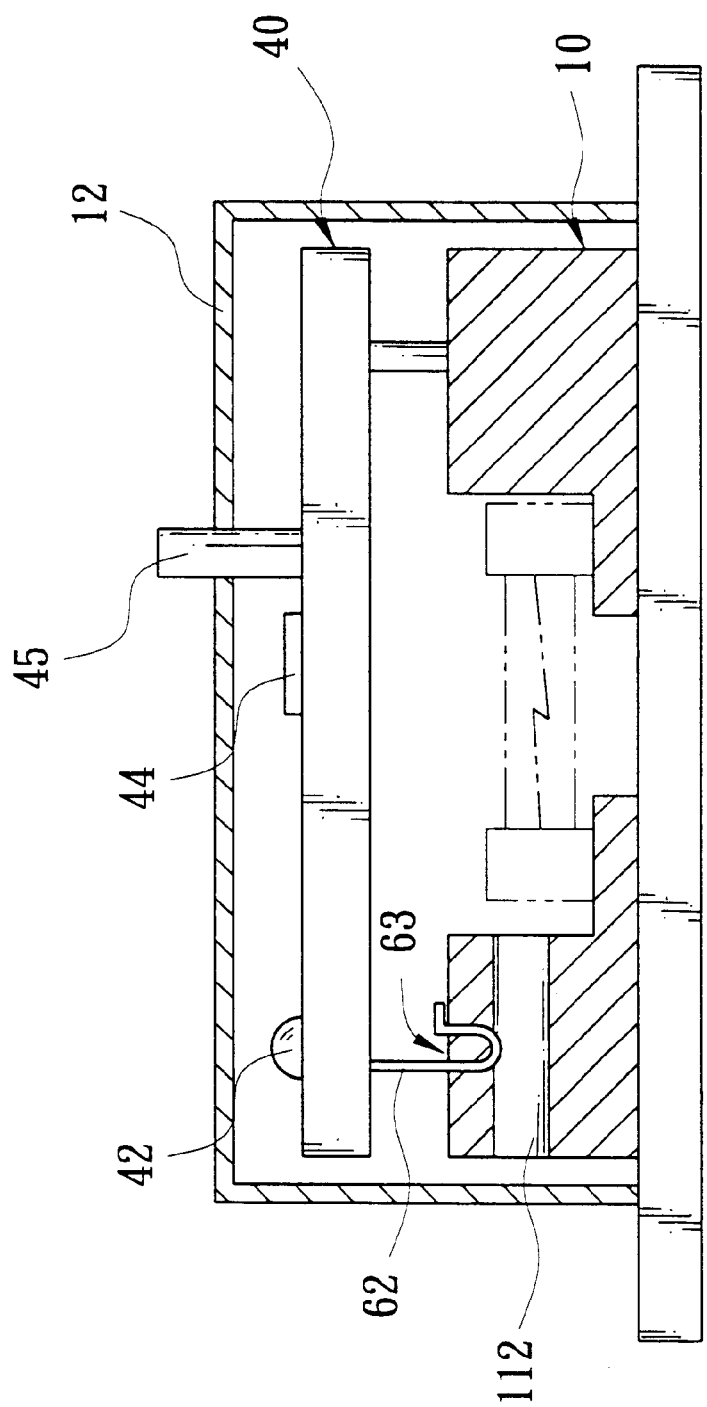
FIG. 2B is a side view in part section illustrating distributor of FIG. 2A.

Referring to FIGS. 2A and 2B, there is shown a first embodiment of the invention comprising a distributor 10 and a circuit module 40. Distributor 10 has an input terminal 111, a plurality of output terminals 112, a cover 12 for preventing dust and foreign bodies from entering the distributor 10, and a plurality of fuse blocks 113 having fuses loaded are provided in the connection between input terminal 111 and output terminals 112 as a safeguard for preventing overload. Circuit module 40 comprises at least one display unit 412, a circuit board 43, and a plurality of flexible pins 62 wherein pins 62 are electrically connected between circuit module 40 and distributor 10 such that circuit board 43 may be electrically activated by the power supplied by distributor 10 through the pins 62. Further, an appropriate representation is displayed on the display unit 412. Circuit board 43 is electrically connected to various elements of circuit module 40.

It is required to electrically connect distributor 10 and circuit module 40 by the invention. As such, a plurality of recessed members corresponding to pins 62 are provided on distributor 10. These recessed members are generally designated elongate slots 1140. The corresponding pins 62 are hook-shaped wherein the straight portion is secured to the bottom surface of circuit module 40 and the curve portion is formed as hook 63. As such, each pin 62 may secure to elongate slot 1140 by the expansion of its resilient hook 63 (FIG. 2B).

The display unit 412 may be implemented as a plurality of light emitting diodes (LEDs) 42 each corresponding to a fuse block 113 on the distributor 10. Pins 62 are electrically between LEDs 42 and fuse blocks 113 (or output terminals 112). An on/off or a selected color (i.e., green means normal, red means abnormal, etc.) may be used to represent whether a corresponding fuse is normal. Optionally, a liquid crystal display (LCD) 41 may be provided to display current or voltage value of distributor 10. It is understood that the electrical devices 30 are connected parallel (as detailed in FIG. 4 later). As such, electrical devices 30 have the same voltage, while current may be different depending on the respective resistance value of each electrical device 30. Further, a button 45 is provided on the circuit module 40 for user to conveniently switch between voltage and current values wherein button 45 is protruded through a hole 121 of cover 12. Still optionally, a relay 44 may be provided on circuit module 40 in order to protect circuit module 40.

Figure 3A:
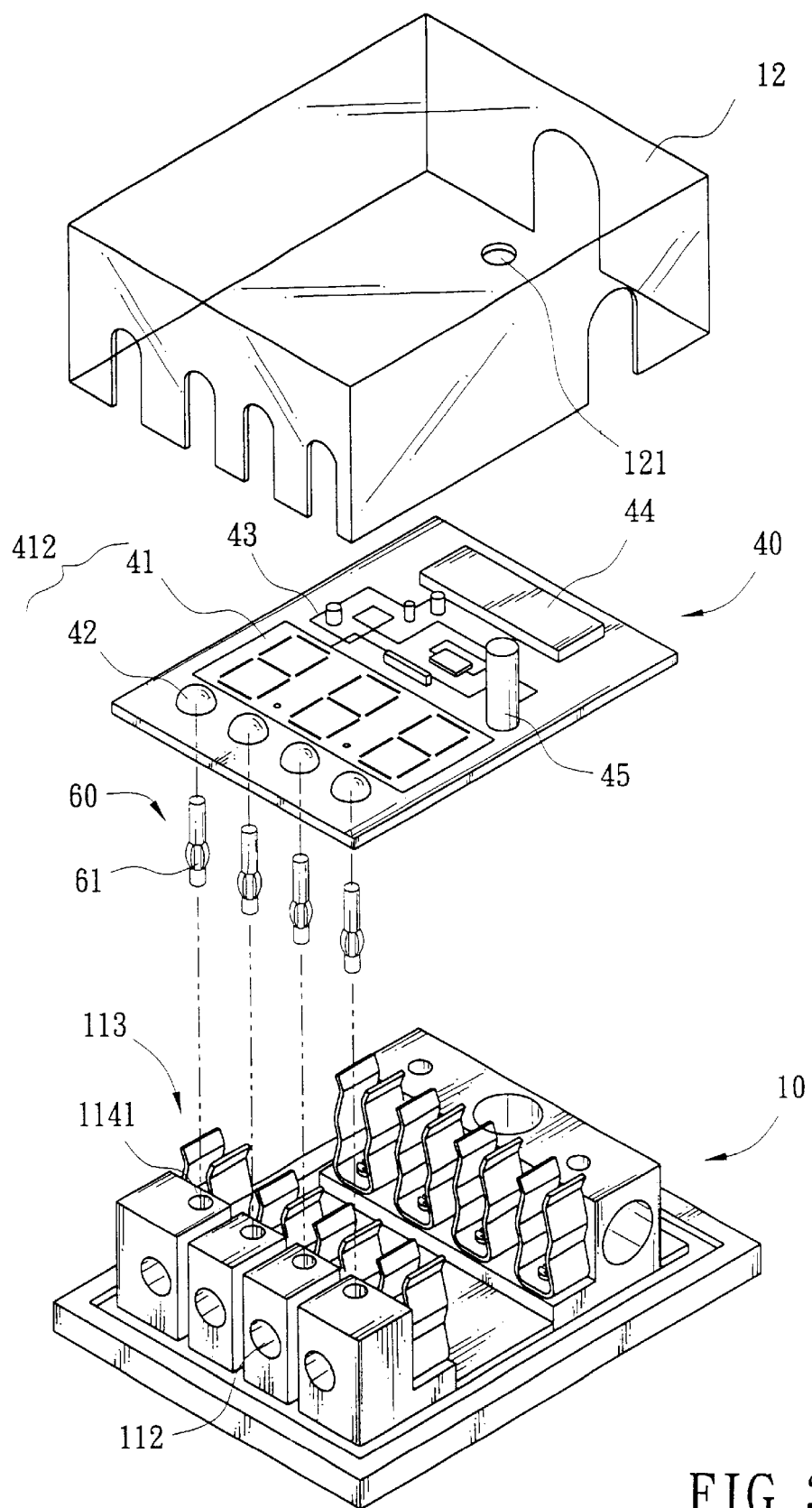
FIG. 3A is a an exploded view illustrating a second preferred embodiment of distributor of the present invention.
Figure 3B:
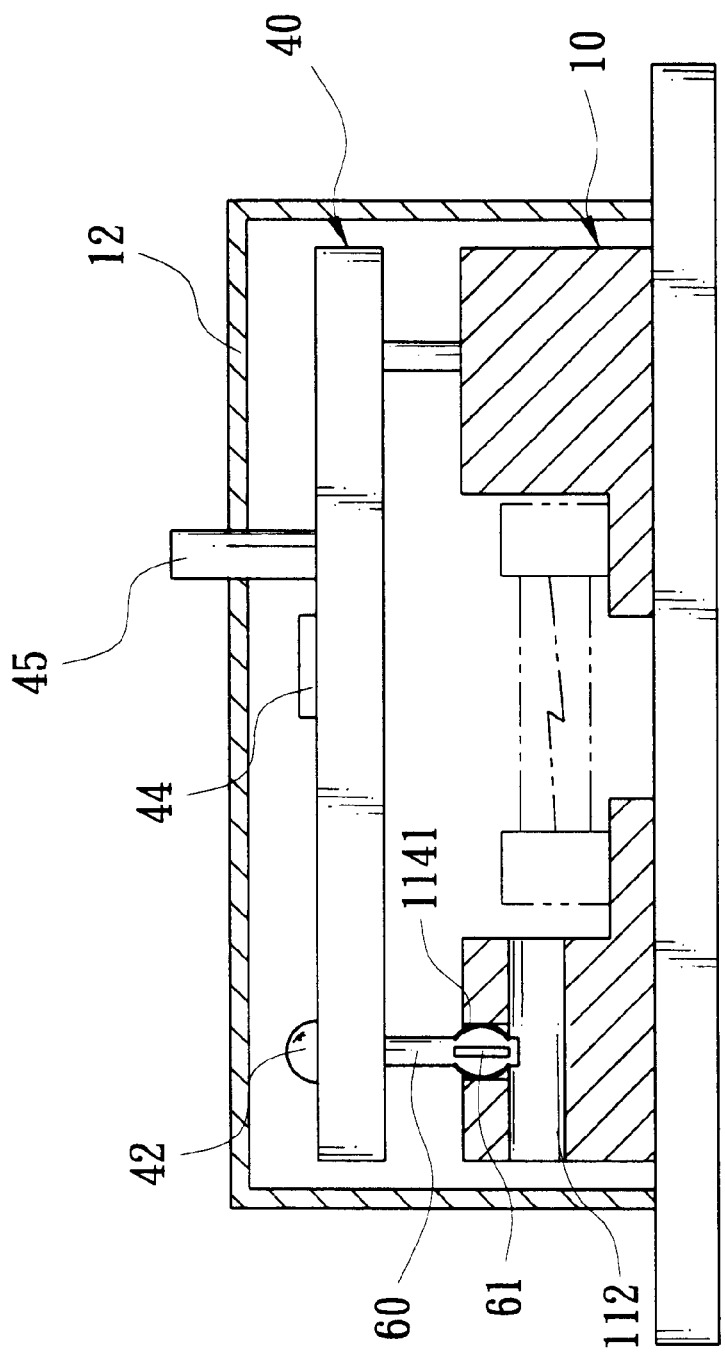
FIG. 3B is a side view in part section illustrating distributor of FIG. 3A.

Referring to FIGS. 3A and 3B, there is shown a second embodiment of the invention. This embodiment generally has the same configuration as the first embodiment except the following. The recessed members are holes 1141, while the corresponding pins 60 are bar-shaped wherein the top of each pin 60 is secured to the bottom surface of circuit module 40 and the lower portion is formed as elastic enlargement 61. As such, each pin 60 may secure to hole 1141 by the expansion of its resilient enlargement 61 (FIG. 3B). Either pins 60 or 62 may secure circuit module 40 to distributor 10 as well as electrically connected between display unit 412 and output terminals 112. Note that each pin 60 should precisely align with hole 1141 for achieving a better fastening. In comparison with the first embodiment, each pin 62 may be engaged with elongate slot 1140 in any position therein, thereby eliminating a precise alignment. However, its engagement is not as secure as the second embodiment.

Figure 4:
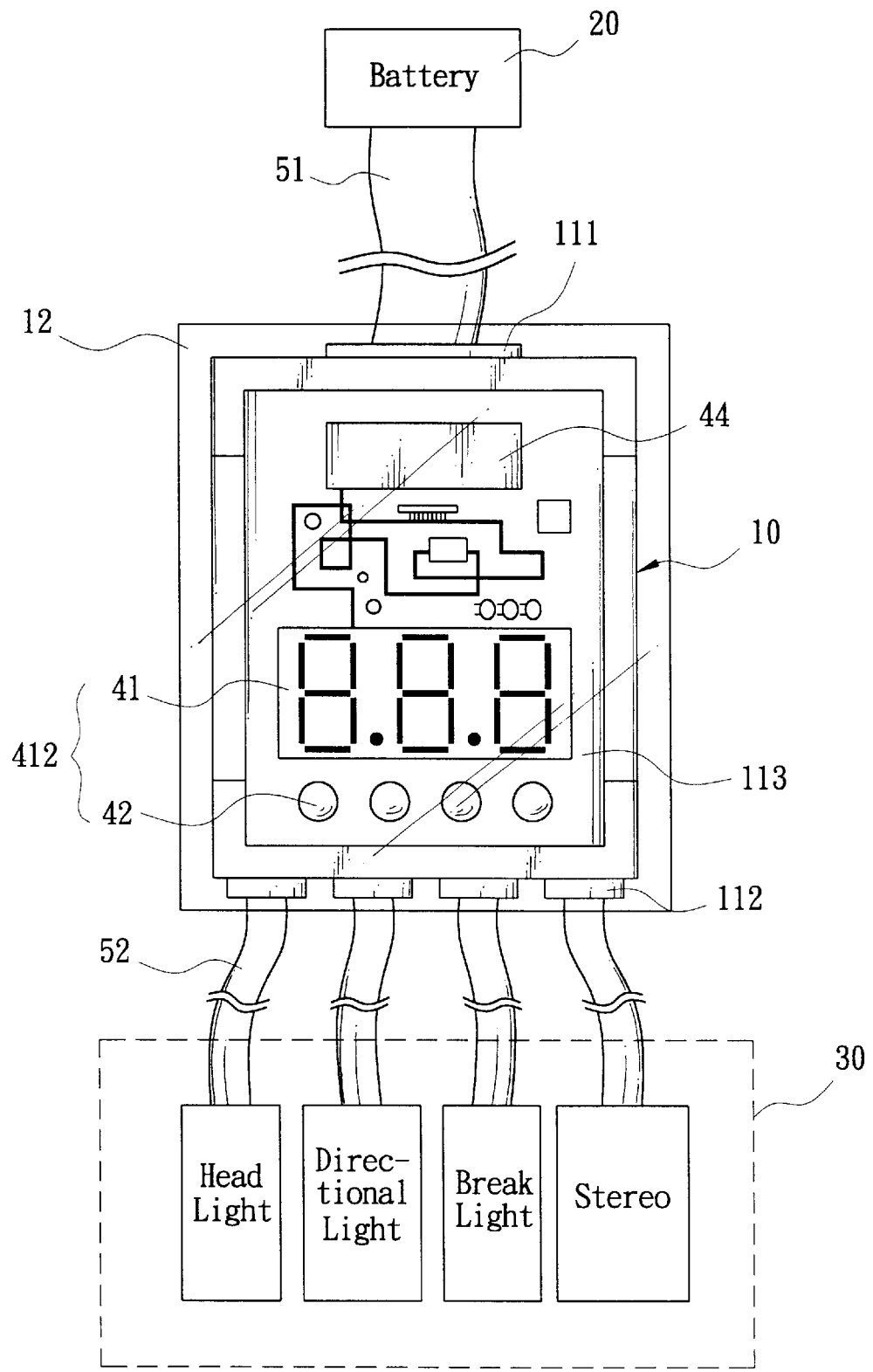
FIG. 4 is a block diagram schematically illustrating the distributor electrically connected between battery and various electrical devices.

Referring to FIG. 4, it is seen that distributor 10 has an input terminal 111 electrically connected to battery 20 through a cable 51 and a plurality of output terminals 112 electrically connected to above electrical devices 30 through a corresponding cable 52. Such that, user may clearly see display unit 412 to know whether there is a malfunction device 30, and thus eliminate the need to prepare a multimeter to measure.

Figure 5A:
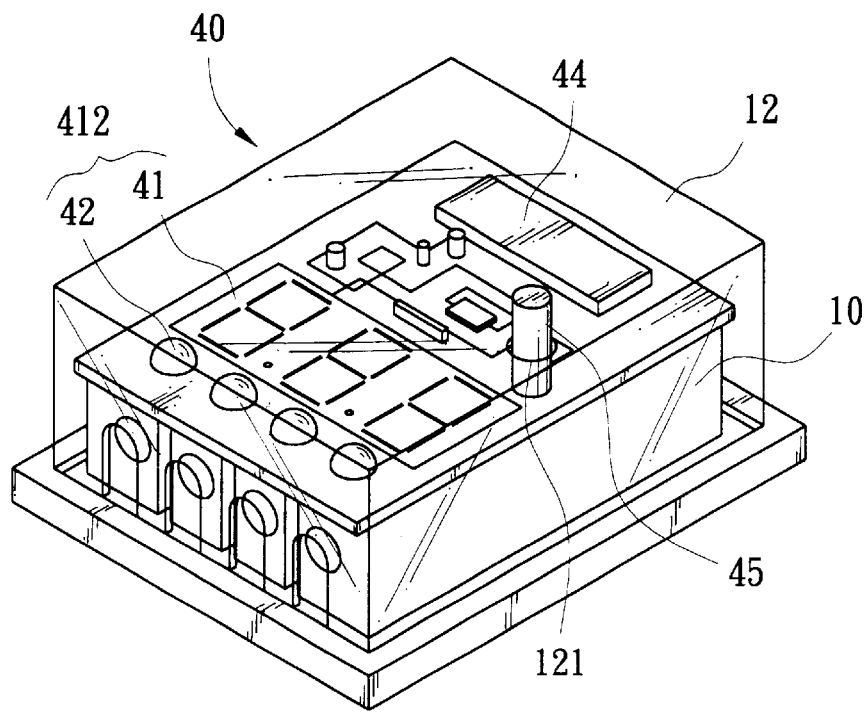
FIG. 5A is a first embodiment of cover.
Figure 5B:
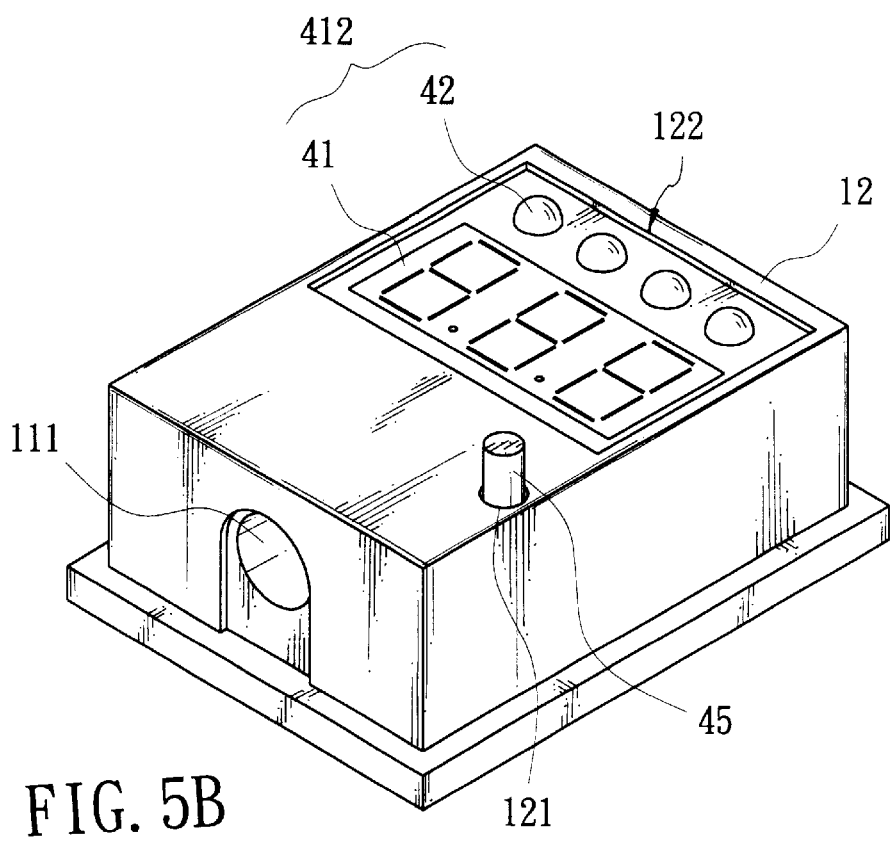
FIG. 5B is a second embodiment of cover.

Referring to FIGS. 5A and 5B, it is understood that cover 12 must be made of a transparent material as shown in FIG. 5A. Alternatively, for example, a glass window 122 is provided above the display unit 412 as shown in FIG. 5B. Both enable user to see the display of display unit 412 from the exterior of cover 12 without opening the cover 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for displaying electrical measurement of electrical means of a motor vehicle comprising:

a distributor for distributing power to the electrical means having a plurality of recessed members; and a circuit module including at least one display unit, a circuit board, and a plurality of flexible pins, wherein the pins are inserted in the recessed member for electrically connecting between the circuit module and the distributor such that the circuit board may be electrically activated by power supplied by the distributor through the pins, thereby a electrical measurement is displayed on the display unit.

2. The apparatus of claim 1, wherein the distributor comprises a plurality of power branches each with a fuse block.

3. The apparatus of claim 1, wherein the display unit comprises a plurality of light emitting diodes (LEDs).

4. The apparatus of claim 1, wherein the display unit comprises a liquid crystal display (LCD).

5. The apparatus of claim 1, wherein the recessed members are elongate slots and the corresponding pins are hook-shaped members.

6. The apparatus of claim 1, wherein the recessed members are holes and the corresponding pins are bar-shaped members.

7. The apparatus of claim 1, further comprising a cover on the distributor.

8. The apparatus of claim 7, wherein the cover is made of a transparent material.

9. The apparatus of claim 7, wherein the cover has an opening positioned corresponding to the display unit.

10. The apparatus of claim 1, wherein the circuit module comprises a button for switching between values of the display unit.

11. The apparatus of claim 10, further comprising a cover on the distributor with a hole for allowing the button to protrude through.

12. The apparatus of claim 10, wherein the button functions as switching between voltage and current values of the electrical means and between current values of the electrical means.

13. The apparatus of claim 1, wherein the circuit module comprises a protective relay.

* * * * *